United States Patent [19]
Bhatt et al.

[11] Patent Number: 5,571,417
[45] Date of Patent: Nov. 5, 1996

[54] METHOD FOR TREATING PHOTOLITHOGRAPHIC DEVELOPER AND STRIPPER WASTE STREAMS CONTAINING RESIST OR SOLDER MASK AND GAMMA BUTYROLACTONE OR BENZYL ALCOHOL

[75] Inventors: Anilkumar C. Bhatt, Johnson City; Gary S. Ksenak, Endwell; Kostas I. Papathomas, Endicott; James A. Shurtleff, Endwell; Jerome J. Wagner, Endicott, all of N.Y.

[73] Assignee: International Business Machines Corporation, Armonk, N.Y.

[21] Appl. No.: 365,088

[22] Filed: Dec. 28, 1994

Related U.S. Application Data

[60] Continuation-in-part of Ser. No. 160,339, Dec. 1, 1993, abandoned, which is a division of Ser. No. 781,542, Oct. 22, 1991, Pat. No. 5,268,260.

[51] Int. Cl.$^6$ ............................................. C02F 3/02
[52] U.S. Cl. ........................ 210/620; 210/626; 210/631; 210/908; 210/909
[58] Field of Search ........................... 210/620, 626, 210/631, 749, 908, 909

[56] References Cited

U.S. PATENT DOCUMENTS

| | | | |
|---|---|---|---|
| 5,268,260 | 12/1993 | Bhatt | 430/325 |
| 5,275,734 | 1/1994 | Shurtleff et al. | 210/626 |
| 5,281,723 | 1/1994 | Bantu et al. | 549/230 |
| 5,296,111 | 3/1994 | Suzuki et al. | 210/626 |

*Primary Examiner*—Peter A. Hruskoci
*Attorney, Agent, or Firm*—Calfee, Halter & Griswold

[57] ABSTRACT

A method is disclosed for using the simple, environmentally-friendly organic compounds gamma-butyrolactone and benzyl alcohol to develop and to strip free radical-initiated, addition polymerizable resists, cationically cured resists and solder masks and Vacrel photoresists. In all cases the developers and strippers include gamma butyrolactone or benzyl alcohol. The developers and strippers optionally also include a minor amount of methanol, ethanol, isopropyl alcohol, propylene glycol monomethylacetate, ethylene glycol monomethyl ether, formamide, nitromethane, propylene oxide, or methyl ethyl ketone, acetone and water. During development of the photopatterned resist or solder mask, the unpolymerized regions are dissolved in the disclosed developers. During stripping of the resist or solder mask, the polymerized regions are debonded from a circuit board in the disclosed strippers. Following removal of the developers and strippers, any residual monomers or polymers of the resist or solder mask as well as residual developing solution and stripping solution are rinsed from the printed circuit package. A method is also disclosed for treating the combined developer and stripper rinse effluents in an activated biomass to reduce the biological oxygen demand of the developer/stripper/resist/solder mask waste streams.

12 Claims, No Drawings

METHOD FOR TREATING PHOTOLITHOGRAPHIC DEVELOPER AND STRIPPER WASTE STREAMS CONTAINING RESIST OR SOLDER MASK AND GAMMA BUTYROLACTONE OR BENZYL ALCOHOL

CROSS-REFERENCE TO RELATED APPLICATIONS

This application is a continuation-in-part of the following commonly assigned, copending U.S. patent application Ser. No. 08/160,339, filed Dec. 1, 1993, now abandoned which is a divisional application of U.S. patent application Ser. No. 781,542 filed Oct. 22, 1991, which issued as U.S. Pat. No. 5,268,260 on Dec. 7, 1993.

BACKGROUND OF THE INVENTION

Photolithography plays a critical role in the art of printed circuit packaging. Photolithography is used to define in a thin film of photoresist those regions either from which copper is to be selectively etched to subtractively form circuitization, or selectively plated to additively form circuitization.

There are basically two types of photoresist: negative acting and positive acting. Positive photoresists are used extensively to fabricate silicon devices. They, however, perform poorly in high caustic environments and high temperatures. The negative resists, on the other hand, are used when the circuit lines are provided by additive plating of copper, in areas where copper is desired, i.e., electroless or electroless plus electroplating, rather than by etching of copper away from where it is not desired.

When a negative photoresist is selectively exposed to the particular radiation to which it is sensitive for an adequate period of time and then subjected to its developer, the areas of the resist which have not been exposed to radiation are removed by the developer, whereas the areas which have been exposed to radiation are hardened thereby by cross-linking and made more resistant to developer, relative to the unexposed regions. On the other hand the positive acting resists behave oppositely; the exposed regions are removed preferentially.

Photolithographic processes in packaging are described in *Microelectronics Packaging Handbook,* Pub. Van Nostrand Reinhold, New York, 1989, Tummala et al., eds. on pages 898–903, in *Principles of Electronic Packaging,* McGraw-Hill Book Company, New York, 1989, Seraphim et al., eds. in Chapter 12, pages 372–393 and in Scientific Encyclopedia, 6th Ed., Vol II, Pub. Van Nostrand Reinhold Company, New York, 1983, Considine et al., eds, pages 1877–1881, all of which are incorporated herein by reference for use as background.

In general negative-working resists include those photopolymerizable materials of the type described in U.S. Pat. No. 3,469,982, U.S. Pat. No. 4,273,857 and U.S. Pat. No. 4,293,635 and the photocrosslinkable species of the type disclosed in U.S. Pat. No. 3,526,504.

Included in the following are monomers which can be used either alone or in combination with others such as those in the conventional photoresists: t-butyl acrylate, 1, 5 pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di-(p-hydroxyphenyl)-propane diacrylate, pentaerythritol tetraacrylate, 2,2-di(p-hydrohyphenyl)-propane dimethacrylate, triethylene glycol diacrylate, polyoxyethyl-2,2-di(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy- 2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy- 2-hydroxypropyl) ether of tetrabromo-bisphenol-A, di-( 2-methacryloxyethyl) ether of tetrabromo-bisphenol-A, di-(3-methacryloxy- 2-hydroxypropyl) ether of 1,4-butanediol, di-(3-methacryloxy- 2-hydroxypropyl) ether of diphenolic acid, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1, 3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the monomers mentioned above, the photoresist material can also contain one or more free radical-initiated and polymerizable species with molecular weight of at least about 300. Monomers of this type are an alkylene or a polyalkylene glycol diacrylate and those described in U.S. Pat. No. 2,927,022.

Free radical initiators which can be activated by actinic radiation which are thermally inactive at and below 185° C. include the substituted or unsubstituted polynuclear quinones listed in the following: 9,10-anthraquinone, 1-chloroanthraquinone, 2-chloroanthraquinone, 2-methylanthraquinone, 2-tertbutylanthraquinone, octamethylanthraquinone, 1,4-naphthoquinone, 9,10-phenanthrequinone, 1,2-benzanthraquinone, 2,3-benzanthraquinone, 2-methyl-1, 4-naphthone, 2,3-dichloronaphthoquinone, 1,4-dimethylanthraquinone, 2,3-dimethylanthraquinone, 2-phenylanthraquinone, 2,3-diphenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione.

Other useful photoinitiators, of which some may be thermally active at temperatures lower than 85° C., are described in U.S. Pat. No. 2,760,863.

Dyes of a photoreducible nature and other reducing agents are described in U.S. Pat. Nos. 2,850,445; 2,875,047; 3,097,096; 3,074,974; 3,097,097; and 3,145,104 as well as dyes of the phenazine, oxazine and quinone clases; Michler's ketone, benzophenone, 2,4,5-triphenylimidazolyl dimers with hydrogen donors, and mixtures thereof as described in U.S. Pat. Nos. 3,427,161; 3,479,185 and 3,549,367 can be used as initiators. The cyclohexadienone compounds of U.S. Pat. No. 4,341,860 are also useful as initiators. In addition sensitizers described in U.S. Pat. No. 4,162,162 in combination with photoinitiators and photoinhibitors are useful.

Polymeric binders which can be used alone, or in combination with other of the same or other polymerizable monomers include the following: polyacrylate and alpha-alkyl polyacrylate esters, i.e., polymethyl methacrylate and polyethyl methacrylate; polyvinyl esters, i.e., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, i.e., with maleic anhydride and esters; vinylidene chloride copolymers, i.e., vinylidene chloride/acrylonitrile; vinylidene chloride/methacrylate and vinylidene chloride/vinyl acetate copolymers; polyvinyl chloride and copolymers, i.e., polyvinyl chloride/acetate; saturated and unsaturated polyurethanes; synthetic rubbers, i.e., butadiene/acrylonitrile, acrylonitrile/butadiene/styrene, methacrylate/acrylonitrile/butadiene/styrene copolymers, 2-chlorobutadiene- 1,3 polymers, chlorinated rubber, and styrene/butadiene/styrene, styrene/isoprene/styrene block copolymers; high molecular weight polyethylene oxides of polyglycols having average molecular weight from about 4,000 to 1,000,000 epoxides, i.e., containing acrylate or methacrylate groups; copolyesters; nylons or polyamides, i.e., N-methoxymethyl, polyhexamethylene adipamide; cellulose esters, i.e., cellulose acetate succinate and cellulose acetate butyrate; cellulose ethers, i.e., methyl cellulose, ethyl cellulose and benzyl cellulose; polycarbonates; polyvinyl acetal, i.e., polyvinyl butyral, polyvinyl formal; polyformaldehydes.

In addition to the polymeric binders listed above, particulate thickeners such as described in U.S. Pat. No. 3,754,920, i.e., silicas, clays, alumina, bentonites, kalonites, and the like can be used.

Where aqueous developing of the photoresist is desirable the binder should contain sufficient acidic or other functionalities to render the composition processable in the aqueous developer. Suitable aqueous-processable binders include those described in U.S. Pat. No. 3,458,311 and in U.S. Pat. No. 4,273,856. Polymers derived from an aminoalkyl acrylate or methacrylate, acidic film-forming comonomer and an alkyl or hydroxyalkyl acrylate such as those described in U.S. Pat. No. 4,293,635 can be included.

Normally, a thermal polymerization inhibitor will be present to increase the stability during storage of the photosensitive compositions. Such inhibitors are: p-methoxyphenol, hydroquinone, alkyl and aryl-substituted hydroqinones and quinones, tert-butyl catechol, pyrogallol, copper resinate, naphthylamines, beta-napthol, cuprous chloride, 2,6-di-tert-butyl-p-cresol, phenothiazine, pyridine, nitrobenzene and dinitrobenzene, p-toluequinone and chloranil. Also useful for thermal polymerization inhibitors are the nitroso compositions described in U.S. Pat. No. 4,168,982.

Dyes and pigments may also be added to increase the visibility of the resist image. Any colorant used however, should be transparent to the actinic radiation used.

An example of such photosensitive compositions is described in Table I of U.S. Pat. No. 4,693,959.

In preparation of these formulations generally inert solvents are employed which are volatile at ordinary pressures. Examples include alcohols and ether alcohols, esters, aromatics, ketones, chlorinated hydrocarbons, aliphatic hydrocarbons, miscellaneous solvents such as dimethylsulfoxide, pyridine, tetrahydrofuran, dioxane, dicyanocyclobutane and 1-methyl-2-oxo-hexamethyleneimine, and mixtures of these solvents in various proportions as may be required to attain solutions. Antiblocking agents to prevent the coatings from adhering to the supporting films can also be included.

With some polymers, it is desirable to add a plasticizer, either solid or liquid, to give flexibility to the film or coating. Suitable plasticizers are described in U.S. Pat. No. 3,658,543. A preferred liquid plasticizer is nolylphenoxypoly(ethyleneoxy)ethanol. A preferred solid plasticizer is N-ethyl-p-toluenesulfonamide.

Photoimagable compositions are also utilized as solder masks in various industrial processes. In such application a photoimagable composition is used by applying the composition to printed circuit board and followed by photolithographic techniques to expose various underlying features on the board while masking others. During the soldering process the solder will deposit onto the exposed underlying components. It is necessary that the solder mask material be formulated such that it can be applied by the appropriate methods, for example curtain coating. Suitable photoimagable compositions including many that use epoxies are described in the following U.S. Pat. Nos. 4,279,985; 4,458,890; 4,351,708; 4,138,255; 4,069,055; 4,250,053; 4,058,401; 4,659,649; 4,544,623; 4,684,671; 4,624,912; 4,175,963; 4,081,276; 4,693,961; and 4,442,197.

More recently an improved cationically photoimagable solder mask is described in U.S. Pat. No. 5,026,624 assigned to the assignee of the present application, disclosure of which is incorporated herein by reference. In fact U.S. Pat. No. 5,026,624 teaches an improved photoimagable cationically polymerizable epoxy based coating material. The material includes an epoxy resin system consisting essentially of between about 10% to about 80% by weight of a polyol resin which is a condensation product of epichlorohydrin and bisphenol A having a molecular weight of between about 40,000 and 130,000; between about 20% and about 90% by weight of an epoxidized octafunctional bisphenol A formaldehyde novolak resin having a molecular weight of 4,000 to 10,000; and between about 35% and 50% by weight of an epoxidized glycidyl ether of tetrabromo bisphenol A having a molecular weight of between about 600 and 2,500 if flame resistant properties are desired. To this resin system is added about 0.1 to about 15 parts by weight per 100 parts of resin of a cationic photoinitiator capable of initiating polymerization of said epoxidized resin system upon expose to actinic radiation; optionally a photosensitizer in an amount of up to about 10 parts by weight may be added.

The solder mask material is normally exposed to UV radiation from a medium pressure mercury lamp through a phototool which is opaque in the areas where the solder mask is to be removed. After exposure to UV radiation, the circuit boards are baked for a short time to accelerate the crosslinking reaction initiated by the sulfonium salt photolysis products. Bake temperatures between about 100° C. and 150° C. and times between about 2 and 10 minutes are used. An example of such formulations is given in U.S. Pat. No. 5,026,624 Table I.

In processing negative working resists, unexposed areas of the imaged film are typically removed from the surface of a printed circuit board or substrate by action of a liquid developer in a spray form for a duration of several minutes or less. Depending on the particular type of photoresist composition the liquid developer may be a simple organic solvent, an aqueous solution of an inorganic base, or as described in U.S. Pat. No. 3,475,171, a combination of organic solvent and aqueous base to form a semi-aqueous developer.

Methyl chloroform (MCF), a/k/a 1,1,1-trichloroethane, and methylene chloride (MC), a/k/a dichloromethane are solvents which are widely used in the electronic packaging art and in other arts for developing and removing a number of photoresists which are otherwise resistant to chemical attack. Highly alkaline electroless copper plating bath used in additive processes, for example, typically provides a harsh environment for photoresist. In general, the more chemically impervious resists are removable in an organic solvent such as methylene chloride. For less demanding chemical environments, aqueous developable photoresists may be adequate. The organically developable resists, however, continue to be used in an electroless copper environment and in the print band and thin film technologies in conjunction with acrylate-based resist such as DuPont's Riston T-168 and solvent process-able solder masks such as the DuPont Vacrel 700 and 900 series, environments in which the aqueous resists are vulnerable.

Use of 1,1,1-trichloroethane and methylene chloride is disfavored because of growing environmental concerns over the effect of gaseous halogenated hydrocarbons on the depletion of earth's ozone layer and concerns over introducing suspected carcinogens to the atmosphere. Several countries have set goals for their total elimination. However, there continue to be many manufacturing processes in which use of resists which are aqueously developable simply is not feasible.

The industry therefore continues to search for organic solvents as alternates to 1,1,1-trichloroethane and methylene chloride. The new solvents must meet specific manufacturing and environmental requirements with respect to flammability, toxicity, ability to effect dissolution, shelf-life, waste disposal, ability to recycle, simplicity of composition, and compatibility with a spectrum of resists.

Alternative solvents for stripping solvent based Riston photoresists are also described in *IBM Technical Disclosure Bulletin*, June 1989, p. 302, published anonymously. There have been previous attempts reported in the art to provide environmentally friendly alternative to 1,1,1-trichloroethane and methylene chloride.

The commonly assigned U.S. Pat. No. 5,268,260 of N. R. Bantu, Anilkumar Bhatt, Ashwindumar Bhatt, G. W. Jones, J. A. Kotylo, R. F. Woen, K. I. Papathomas, and A. K. Vardya for Photoresist Develop and Strip Solvents and Method for Their Use, incorporated herein by reference, describes the use of propylene carbonate, gamma-butyrolactone and benzyl alcohol as alternatives to halogenated hydrocarbon developers and strippers for use in developing and stripping acrylated-based photoresist such as DuPont Riston T-168 and solvent-processable solder masks such as the Varcel 700 and 900 series.

U.S. Pat. No. 5,268,260 describes developing and stripping the radiation-exposed resist in a high boiling solvent selected from the group consisting of propylene carbonate (PC) gamma butyrolactone (BLO) and benzyl alcohol (BA). The developing process occurs at about 25 to 45 degrees centigrade and the stripping process occurs at about 50 to 100 degrees centigrade.

At the end of each process the high boiling solvents, propylene carbonate, gamma-butyrolactone and benzyl alcohol, must be rinsed from the photoresist or solder mask with a compatible solvent or water. The effluents produced by these processes are impure solutions of propylene carbonate, gamma-butyrolactone and/or benzyl alcohol, laden with both dissolved and suspended photoresist or solder mask and other impurities. The commonly assigned U.S. Pat. No. 5,275,734 of J. A. Shurtleff, and K. P. Unger for Chemical Pre-Treatment and Biological Destruction of Propylene Carbonate Waste Streams Effluent Streams to Reduce the Biological Oxygen Demand Thereof describes a method of treating a process waste stream containing the non-biodegradable solvent propylene carbonate. However, none of the references provide a method for treating the waste streams which result from developing or stripping photoresists and solder masks with gamma-butyrolactone and/or benzyl alcohol.

SUMMARY OF THE INVENTION

It is an object of the invention to provide a method for developing acrylate-based photoresist such as Riston T-168 and polymethyl methacrylate, and solvent processable solder masks such as the DuPont Vacrel 900 series, free radical initiated, additive polymerizable, acrylate monomer, dry film solder masks. The proposed method includes developing the radiation-exposed resist in a high boiling solvent selected from the group consisting of propylene carbonate (PC), gamma-butyrolactone (BLO) and benzyl alcohol (BA). The process occurs at about 15° to 45° C. for about 0.5–12 minutes and is normally followed by a warm water or alternate low boiling solvent rinse to remove excess developer. The rinse containing resist and solvent is then aerated in an activated biomass to reduce its biological oxygen demand.

Alternatively, the developer may include also, in amount of about 0.1 up to about 10% by weight of additive selected from the group consisting of methanol, ethanol, isopropyl alcohol, propylene glycol, monomethyl acetate, ethylene glycol, monomethyl ether, formamide, nitromethane, propylene oxide, methyl ethyl ketone, acetones and water.

Still another object of the invention is to provide a method for stripping acrylate based photoresist such as Riston T-168 and Vacrel 700 and 900 series or any solvent processable photoresist or solder mask and a method for stripping a polymethyl methacrylate resist which comprises stripping the radiation-exposed resist in a high boiling solvent such as propylene carbonates gamma-butyrolactone, and benzyl alcohol.

The present invention utilizes solvents of a non-toxic nature for stripping Riston type photoresists or solder masks effectively. It has been found that improved dissolution times can be achieved for the solvents benzyl alcohol and gamma-butyrolactone with stripping temperatures between 50° C. and 100° C. and with conditions which are incorporated in the present invention. When the aforementioned solvents are employed, the process occurs at about 100° C. for about 6 to about 12 minutes and is normally followed by a warm water rinse to remove excess stripper. The rinse is then subjected to degradation by an activated biomass to reduce the biological demand of the spent stripper/resist.

Alternatively, the stripper may include also, in amounts of about 0.1 up to about 10% by weight, additive selected from the group consisting of methanol, ethanol, isopropyl alcohol, propylene glycol monomethyl acetate, ethylene glycol monomethyl ether, formamide, nitromethane, propylene oxide, methyl ethyl ketone, acetone and water.

It is a further object of the invention to reduce the biological oxygen demand of the benzyl alcohol and gamma-butyrolactone waste streams.

BRIEF DESCRIPTION OF THE PREFERRED EMBODIMENTS

In order to facilitate understanding of the present invention, this description includes first a brief outline of the methods used to develop and to strip photopatterned compositions. The outline is followed by a number of non-limiting detailed examples in which gamma-butyrolactone or benzyl alcohol is used to develop or to strip acrylate-based photoresists or solvent processable solder masks.

In brief, an acrylate-based or epoxy-based photoimagable film (either negative acting or positive acting) which has been applied to a circuit board is patterned by exposure of preselected regions to actinic radiation. To develop the resulting pattern of polymerized and unpolymerized material, the coated board is contacted with a liquid developer composed primarily of benzyl alcohol or gamma-butyrolactone either by dipping or spraying. The unpolymerized material is dissolved in these developers at low temperature, preferably between 15° C. and 45° C.

The dissolved resist or solder mask components, which consist primarily of monomers, and developing solution are then removed from the board by allowing the solution to run off into a containment tank. The removal of the photoresist or solder mask can be assisted by a squeegee roll action. The collected solvent may be recycled for further use. To further enhance development of the pattern, the residual resist or mask and developing solution are rinsed from the board, preferably with warm water. Low vapor pressure organic solvents, such as isopropyl alcohol, acetone, methyl ethyl ketone and xylene, may also be used as a rinse.

The board is then circuitized either by an additive plating or subtractive etching process. Thereafter, the polymerized photoresist or solder mask may be stripped from the board, preferably by spraying with gamma-butyrolactone or benzyl alcohol at elevated temperatures, preferably between 50° C. and 100° C. The stripping solution causes the polymerized film to swell, debond, i,e, detach from the underlying substrate and flake off of the board. The stripping can be assisted by gentle scrubbing with brushes. The resist particles or solder mask particles and stripping solution are then removed from the board, preferably by brushing into a containment tank. Any residual polymerized film particles and stripping solution are rinsed from the package, preferably at elevated pressures, preferably with warm water. The water rinse can be replaced by rinsing in low vapor pressure solvents.

The developing rinse and stripping rinse waste streams are combined and together contain solutions of gamma-butyrolactone (BLO) and/or benzyl alcohol (BA) at a range of concentrations along with the dissolved and particulate resist or solder mask. The polymer, whether solubilized or dispersed, is referred to herein as "solids." The rinse is thereafter aerated in an activated biomass to reduce its biological oxygen demand. The microorganisms in the activated biomass convert the organic solvents, gamma-butyrolactone and benzyl alcohol, and the hydrocarbon portions of the organic solids to $CO_2$ and $H_2O$.

The following non-limiting examples provide additional details of methods used for developing photopatternable acrylate-based photoresists and solvent processable solder masks in a developing solution composed primarily of gamma-butyrolactone or benzyl alcohol. The following non-limiting examples also provide details of methods used for stripping polymerized acrylate-based photoresists and solder masks from a circuit board in a stripping solution composed primarily of gamma-butyrolactone or benzyl alcohol. Details of the procedures used to reduce the biological oxygen demand of the combined developing rinses and stripping rinses are also provided.

EXAMPLE 1—DEVELOPING PHOTORESIST

Signal cores having dimensions 24 inch by 28 inch were obtained after circuit line exposure in Riston T-168 and placed in the developer while agitating. Experimental conditions of time, temperature, and solvents are given in Table I. After the line channels were clean, samples were rinsed with hot water. The developed panels were subjected to additive copper plating. Line widths and line flaring were measured by cross-sectioning part of the panel.

Results obtained from the above experimental conditions (Table II) indicate no significant deviation from the normal process of using methyl chloroform (MCF) as the developer. The MCF was obtained as MCF-348PPG, from Pittsburgh Plate Glass. It is believed that this form of MCF includes inhibitor, such as acid buffer. However, the gamma-butyrolactone (BLO) and benzyl alcohol (BA) develop processes were found to be more sensitive to temperature than was the propylene carbonate (PC). These solvents can be used in both dip and spray process conditions.

It should be noted that the development and rinse steps in all Tables have been given upper working limits only because it would be inefficient to extend the times. Therefore, times beyond those noted are deemed to be equivalents of those in the Tables.

TABLE I

| Solvent | BP (°C.) | Development | | Water Rinsing | |
|---|---|---|---|---|---|
| | | Temp (°C.) | Time (Mins) | Temp (°C.) | Time (Mins) |
| PC | 240 | 23–40 | 6–12 | 46–55 | 5–10 |
| BLO | 205 | 16–23 | 5–9 | 46–55 | 5–10 |
| BA | 205 | 16–25 | 6–10 | 46–55 | 5–10 |

TABLE II

| | MCF-348PPG | PC | BLO |
|---|---|---|---|
| Average Line width (mil) | 3.252 | 3.441 | 3.517 |
| Line Angle (degrees) | 84.7 | 83.8 | 78.0 |
| X-Area (% of rectangle) | 95.5 | 95.7 | 91.9 |
| Adhesion Strength (gm/mil) | 17 | 14 | 21 |

EXAMPLE 2—STRIPPING POLYMERIZED PHOTORESIST

Signal cores having dimensions 24 inch by 28 inch were obtained after circuit line exposure in Riston T-168 and developed using propylene carbonate. Coupons from these panels having exposed Riston T168 were then tested in stripping experiments.

The stripping ability and dissolution times were measured for the various solvents at a range of temperatures listed in Table III. To obtain dissolution times comparable to those of MCF, it was necessary to maintain the temperature between 50° Centigrade and 100° Centigrade during stripping with BLO and BA. It was also observed that use of scrubbing brushes lowered the solvent residence time and reduced the residual resist level on the circuit boards.

Improved experimental conditions for propylene carbonate (PC) and gamma butyrolactone (BLO) in stripping T168 are shown in Table IV. The values shown in parentheses are the preferred conditions. Water rinse conditions in combination with the conditions in Table IV for the propylene carbonate and gamma butyrolactone were the following: rinse temperature: between about 20°–60° C., with the most preferred being about 30°–40° C.; rinse pressure: between about 15–60 psi, with the preferred being about 25–35 psi;

and rinse time: between about 5–20 minutes, with the most preferred being about 8–15 minutes.

TABLE III

Dissolution time of crosslinked T168 for high boiling solvents. Dissolution time is in minutes.

| TEMP (°C.) | PC | BLO | MCF-348PPG | BA | MC |
|---|---|---|---|---|---|
| 24 | 190 | 190 | 190 | 190 | 1.5 |
| 40 | 75 | 22 | 45 | — | — |
| 50 | 25 | 6 | 15 | — | — |
| 60 | 8 | 3 | 6 | 4 | — |
| 80 | 1.4 | 0.22 | 0.85 | — | — |
| 100 | 0.23 | 0.02 | 0.12 | — | — |

TABLE IV

| Solvent | Temp (°C.) | Time (min) | Pressure (psi) |
|---|---|---|---|
| MC | 26–32 | 10–15 | 15–40 |
| PC | 50–100 | 5–30 | 15–90 |
|  | (64–86) | (8–15) | (50–75) |
| BLO | 50–100 | 5–30 | 15–90 |
|  | (50–60) | (8–15) | (50–75) |

EXAMPLE 3—DEVELOPING A PHOTOPATTERNED SOLDER MASK

Coupons were made from composites coated with DuPont Vacrel 930, free radical initiated, additive polymerizable, acrylate monomer, dry film solder mask material were obtained and placed in gamma-butyrolactone while stirring. Development time was observed to be about 2 minutes at about 22° C. Coupons were processed through hot water rinse to remove any solvent residue. All coupons were processed through the following steps after solvent developing. A) Post Develop Vacuum Bake: 150° C., 2 hrs.; B) UV Bump: 6 Joules; and C) Vapor Blast: Conveyor speed, 2.06 ft/minute; Spring pressure: 35 psi, Blast medium, Aluminum oxide. After above steps (A, B, C), all coupons were processed through the normal post-Vacrel clean cycle and tin immersion solder line.

EXAMPLE 4—STRIPPING POLYMERIZED SOLDER MASK

Coupons wherein Vacrel 930 had been exposed to actinic radiation were placed in gamma-butyrolactone and agitated at 60° C. The exposed Vacrel was stripped off the surface of the laminate within 2.5 minutes.

EXAMPLE 5—TREATMENT OF COMBINED DEVELOPING RINSE AND STRIPPING RINSE

In the embodiment of the invention where the polymer is an acrylate-based photoresist and the solvent is gamma-butyrolactone or benzyl alcohol, the effluent of the photolithographic process contains (i) above about 80 weight percent BLO or BA, and generally from about 70 to about 99.9 weight BLO or BA, (ii) up to about 20 weight percent photoresist materials, and generally from about 0.01 weight percent to about 20 weight percent of "photoresist materials," i.e., "solids," that is, both dispersed solid polymer and dissolved, solubilized polymer, (iii) up to about 5 weight percent, and generally from about 0.1 weight percent to about 2.5 weight percent of water. These weight percentages should total 100 weight percent, but may total less than 100 weight percent if other impurities are present.

In the embodiment of the invention where the polymer is either an acrylate-based photoresist or a solvent-processable solder mask, the photolithographic process also gives rise to a gaseous stream of the stripper. The gaseous effluent arises because of the use of brushing and temperatures above about 50° C., and generally from about 50° C. to about 100° C. in the photolithographic process. These relatively high temperatures introduce the necessity of dealing with gaseous gamma-butyrolactone (BLO) or benzyl alcohol (BA), at least at the hundreds to thousands of parts per million level.

The gaseous BA or BLO is scrubbed in an air scrubber by first removing the BA or BLO bearing gas, as air, from the developing or stripping process, and passing the BA or BLO bearing gas through an aqueous alkaline liquid in an air scrubber to scrub the BA or BLO from the gas. The scrubbed air, substantially free of airborne BA or BLO vapors is recovered from the process.

Both (i) scrubbed air substantially free of BA and BLO and (ii) an alkaline liquor containing the residue of the scrubbed BA or BLO are recovered. The alkaline liquor is combined with the liquid rinses of the developing and stripping processes and collected in a holding tank or mixing tank. The approximate concentration of gamma-butyrolactone/T168 (BLO/T168) or benzyl alcohol/T168 (BA/T168) in the collected waste solution is approximately 5 g/L. The pH of the solution is typically 8 to 10.

To reduce the biological oxygen demand (BOD) and chemical oxygen demand (COD) of the collected waste streams, the combined waste solution is aerated in an activated biomass made from the naturally-occurring microorganisms found in ground water or from a blend of Bi-Chem (R) 1738 W and Bi-Chem (R) 1008 SF obtained from Sybron Chemicals, Inc. The activated biomass contains microorganisms, such as bacteria, flagellates, rotifers, and ciliates capable of aerobically metabolizing the BA/T168 or BLO/T168 hydrocarbons to $CO_2$ and $H_2O$.

Prior to introduction into the biomass, the temperature of the solution is adjusted to 15°–25° C. and the pH adjusted to about 7.5 to 8.5. Neutralization is carried out by adding a dilute acid, such as dilute sulfuric acid or any other acid not toxic to the microorganisms in the activated biomass. The dilute acid may be 10 weight percent sulfuric acid.

The amount of dissolved oxygen in the biomass before and after addition of the solution is maintained at 1.5 to 2.5 ppm by sparging air into the activated biomass. The sparging action also serves to agitate and mix the biomass and added solution. The respiration rate of the biomass preferably is maintained between about 100 to 60 ml $O_2$/L bioamss/hr upon addition of the waste solution to about 15 ml $O_2$/L biomass/hr at the end of the treatment. To maintain the microorganisms in the bioamass, the minimum BOD of the activated biomass is about 100 ppm and the minimum COD is about 200 ppm.

The mean residence time of the BLO/T168 and BA/T168 in the activated biomass extended aeration biological treatment system is long enough to obtain the desired reduction in BOD of the BA/T168 or BLO/T168. With an inlet waste solution BOD loading of about 860 ppm, and a BOD reduction of at least about 95%, the residence time is at least about 48 hours for BA/T168. With an inlet waste solution BOD loading of about 960 ppm, and a BOD reduction of at least 95%, the residence time is at least about 48 hours for BLO/T168. These times are also sufficient to reduce the COD of the added BLO/T168 and BA/T168 by 70–85%.

Thus, according to the method of the invention, there is provided a process for reducing the biological oxygen demand of the waste streams which result from developing and stripping of photoresists and solder masks in the high boiling solvents gamma-butyrolactone and benzyl alcohol.

It is understood that the invention may be embodied in modifications of the present invention forms without departing from the spirit or central characteristics thereof. The aforementioned examples and embodiments are therefore to be considered in all respects as illustrative rather that restrictive and the invention is not to be limited to the details given herein.

What is claimed is:

1. A method of treating a waste stream from a photolithographic process producing a gamma-butyrolactone waste stream consisting essentially of the following steps:

(a) collecting the waste stream at a pH of about 8 to 10;

(b) acidifying the waste stream to a pH of about 7.5 to 8.5; and (c) aerating the acidified waste stream in an activated biomass capable of aerobically metabolizing the gamma-butyrolactone and thereby forming water and carbon dioxide and reducing the biological oxygen demand of the gamma-butyrolactone.

2. The method of claim 1 comprising aerating the acidified waste stream for a time sufficient to reduce the biological oxygen demand by at least about 95%.

3. A method of treating a waste stream from a photolithographic process producing a benzyl alcohol waste stream consisting essentially of the following steps:

(a) collecting the waste stream at a pH of about 8 to 10;

(b) acidifying the waste stream to a pH of about 7.5 to 8.5; and (c) aerating the acidified waste scream in an activated biomass capable of aerobically metabolizing the benzyl alcohol and thereby forming water and carbon dioxide and reducing the biological oxygen demand of the benzyl alcohol.

4. The method of claim 1 comprising aerating the acidified waste stream for a time sufficient to reduce the biological oxygen demand by at least about 95%.

5. A method of treating a waste stream from a photolithographic process, wherein the waste stream contains photoresist and gamma butyrolactone and the method consists essentially of the following steps:

(a) collecting the waste stream at a pH of about 8 to 10;

(b) acidifying the waste stream to a pH of about 7.5 to 8.5; and (c) aerating the acidified waste stream in an activated biomass capable of aerobically metabolizing the gamma-butyrolactone and thereby forming water and carbon dioxide and reducing the biological oxygen demand of the waste stream.

6. The method of claim 5 wherein a waste stream having a biological oxygen demand of about 960 ppm is aerated at least about 48 hours.

7. The method of claim 5 further comprising the step of sparging air into the biomass to maintain the amount of dissolved oxygen in the biomass at 1.5 ppm to 2.5 ppm.

8. The method of claim 5 wherein the respiration rate of the biomass is maintained between about 100 to 60 ml $O_2$/L of biomass/hr upon addition of the waste stream to about 15 ml $O_2$/L biomass/hr at the end of the treatment.

9. A method of treating a waste stream from a photolithographic process, wherein the waste stream contains benzyl alcohol and photoresist and the method consists essentially of the following steps:

(a) collecting the waste stream at a pH of about 8 to 10;

(b) acidifying the waste stream to a pH of about 7.5 to 8.5;

(c) aerating the acidified waste stream in an activated biomass capable of aerobically metabolizing the benzyl alcohol and thereby forming water and carbon dioxide and reducing the biological oxygen demand of the waste stream.

10. The method of claim 9 wherein a waste stream having a biological oxygen demand of about 860 ppm is aerated at least about 48 hours.

11. The method claim 9 further comprising the step of sparging air into the biomass to maintain the amount of dissolved oxygen in the biomass at 1.5 ppm to 2.5 ppm.

12. The method of claim 9 wherein the respiration rate of the biomass is maintained between about 100 to 60 ml $O_2$/L of biomass/hr upon addition of the waste stream to about 15 ml $O_2$/L biomass/hr at the end of the treatment.

* * * * *